(12) United States Patent
Kuo et al.

(10) Patent No.: US 6,877,103 B2
(45) Date of Patent: Apr. 5, 2005

(54) BUS INTERFACE TIMING ADJUSTMENT DEVICE, METHOD AND APPLICATION CHIP

(75) Inventors: Hung-Yi Kuo, Hsin-Tien (TW); I-Ming Lin, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 633 days.

(21) Appl. No.: 10/055,567

(22) Filed: Jan. 22, 2002

(65) Prior Publication Data
US 2004/0078706 A1 Apr. 22, 2004

(30) Foreign Application Priority Data

Oct. 5, 2001 (TW) ........................................ 90124629 A
Oct. 5, 2001 (TW) ........................................ 90124630 A
Oct. 5, 2001 (TW) ........................................ 90124631 A

(51) Int. Cl.$^7$ .............................. G06F 1/04; G06F 1/14
(52) U.S. Cl. ......................... 713/500; 713/502; 710/58; 710/305; 714/43
(58) Field of Search .................................. 713/400, 500, 713/502, 503; 710/58, 60, 305; 714/43

(56) References Cited

U.S. PATENT DOCUMENTS

| | | | | |
|---|---|---|---|---|
| 5,159,291 A | * | 10/1992 | Ghoshal | 331/1 A |
| 5,757,381 A | * | 5/1998 | Shoji et al. | 345/684 |
| 5,978,926 A | * | 11/1999 | Ries et al. | 713/501 |
| 6,502,212 B1 | * | 12/2002 | Coyle et al. | 714/43 |

* cited by examiner

*Primary Examiner*—Rehana Perveen
(74) *Attorney, Agent, or Firm*—J.C. Patents

(57) ABSTRACT

A timing adjustment device, method and chip for a bus interface. Through repetitive adjustment of the amount of phase shift in the clocking signal to the bus interface, read/write testing of the bus interface and checking for the correctness of the read/write data, suitability of the phase shift in the memory bus clocking signal for operating normally is determined. Hence, a safety range for the amount of phase shift in the bus interface timing signal is found and the phase shift of the bus interface timing signal is set to the mid-point of the safety range. The method may also be applied to a system bus and the timing adjustment of signals between a control chipset bus and a memory bus.

39 Claims, 6 Drawing Sheets

US 6,877,103 B2

BUS INTERFACE TIMING ADJUSTMENT DEVICE, METHOD AND APPLICATION CHIP

CROSS-REFERENCE TO RELATED APPLICATION

This application claims the priority benefit of Taiwan applications serial nos. 90124629 filed Oct. 5, 2001, 90124630 filed Oct. 5, 2001, and 90124631, filed Oct. 5, 2001.

BACKGROUND OF THE INVENTION

1. Field of Invention

The present invention relates to a timing adjustment device and method. More particularly, the present invention relates to a bus interface timing adjustment device, method and application chip.

2. Description of Related Art

Due to increasing complexity of circuit boards, proper design of trace lines linking various devices and the processing of timing signals between different devices is increasingly difficult. In general, the chip manufacturer will provide necessary AC timing signals for synchronizing various devices on an integrated chip. However, due to difference in conditions of silicon chip manufacturing, trace layout or method of producing the printed circuit board (PCB), accuracy of the timing signal is often compromised.

Using the computer as an example, most computer systems are comprised of a central processing unit (CPU), a north bridge device and a south bridge device (the north bridge device and the south bridge device together constitute a control chipset, or chipset in short). The central processing unit is coupled to the north bridge device. The north bridge device and the south bridge device are connected together through a high-speed bus. The north bridge device also exercises control over high-speed dynamic random access memory (DRAM). Principle function of the south bridge device includes controlling peripheral devices. The central processing unit and the north bridge device access data via a system bus. Similarly, the south bridge device and the north bridge device access each other's data through the control chipset bus. The north bridge device controls the high-speed dynamic random access memory through a memory bus. Hence, when the central processing unit and the north bridge device as well as the south bridge device and the north bridge device are conducting some data transactions, any mismatch in the trace line of circuit may lead to timing deviation. Serious timing deviation may result in data access errors and system instability. At present, however, most north bridge devices and south bridge devices have no special features for making timing and boost-signal driver adjustment. Thus, whenever there is a timing mismatch that results from a difference in chip property, printed circuit board layout and quality due to surface mount technology (SMT), trace lines for the circuit board must be re-routed again leading to an increase in production time and cost.

Furthermore, the clocking signal received by the memory of a computer system deviates according to the number of dual memory modules and the number of memory chips on the dual memory module plugged into the system. Hence, gauging the timing variation between the memory and the memory control device is very difficult. Because of this, the memory control device often has a register especially reserved for adjusting the timing at the memory interface. Yet, the adjusting value inside the register is normally stored as a fixed value inside the basic input/output system (BIOS) and that value is difficult to change. To counteract differences due to manufacturing by various wafer manufacturers, differences due to bus layout on printed circuit boards and differences due to surface mount technologies, the adjusting value must be changed according to the actual conditions. This arrangement is not only cumbersome, but also leads to frequent inaccuracies. Another method is to provide a buffer to serve as an internal delay for clocking signal for adjusting the timing signals. However, this method can delay the phase of internal clocking signals only. Since there is no way to push the phase of the internal clocking signal forward, this method can have only limited accuracy.

SUMMARY OF THE INVENTION

Accordingly, one object of the present invention is to provide a timing adjustment device and method for a bus interface. Through repeated adjustment of the phase shift of bus interface clocking signal, a conduction of a read/write test of the bus interface and an inspection of the resulting read/write data to check for correctness, a range of phase shift in the bus interface clocking signal suitable for operating normally is determined. Thereafter, the phase shift value of the bus interface clock signal is set to a mid-value within the normal-operating phase shift range. In this way, data access by those devices linking with the bus is stabilized and the need for re-designing circuit layout or fabricating a new bus interface is avoided. Hence, production cost and some rework time is saved.

To achieve these and other advantages and in accordance with the object of the invention, as embodied and broadly described herein, the invention provides a timing adjustment device for a bus interface capable of preventing read/write errors due to timing deviation in bus interface. The timing adjustment device includes a cycle protocol device, a special pattern device, an add/subtract device and a phase lock loop (PLL) device. The cycle protocol device generates special read/write cycle signals for linking any devices having connection with the bus interface. The phase lock loop device is coupled to the bus interface for receiving an internal clocking signal. The internal clocking signal is phase-shifted to become a bus interface clock signal so that a special read/write test sample is sent to the bus and data is received back from the bus. The special pattern device is coupled to the cycle protocol device. According to the special read/write cycle signal generated by the cycle protocol device, the special read/write test sample is produced cyclically so that read/write test samples are repeatedly transferred to the bus interface and the resulting read/write data from the bus interface are checked for correctness. The add/subtract device is coupled to the phase lock loop device for adjusting and setting the phase shift in the clocking signal of the phase lock loop device. In addition, the phase lock loop device also receives a signal N for setting the phase shift resolution of the phase shift in the clocking signal of the phase lock loop device. According to the inspection result of the special pattern device, this invention also carries out a computation to find the range of phase shift under which the clocking signal of the phase lock loop still operates normally. Degree of phase shift for the clocking signal of the phase lock loop device is set to the mid-value of the safety range.

This invention also provides a timing adjustment device for a system bus interface. The system bus interface couples with a system bus and the system bus couples with a central processing unit. The adjustment device includes a cycle protocol device, a special pattern device, an add/subtract device, a phase lock loop device and a core logic device.

In the process of adjusting the central processing bus interface and as a chipset begins to transmit data timing signals to the central processing unit, the core logic device will begin to assert a central processing unit rest signal to the central processing unit. Hence, the central processing unit is restarted. An add/subtract control signal is sent to the add/subtract device so that the add/subtract device increases or decreases phase adjusting signals accordingly.

In the process of adjusting the central processing bus interface and at the same time as the chipset begins to transmit data timing signals to the central processing unit, the cycle protocol device will generate special timing cycles and then outputs expected timing signals to the special pattern device. On receiving the expected timing signals, the special pattern device uses the special timing cycles to output special sample format signals to the system bus interface.

On receiving the phase adjusting signal and an internal clocking signal (CLK), the phase lock loop device shifts the internal clocking signal according to the phase adjusting signal. Thereafter, the phase lock loop device outputs the phase-shifted clocking signal to the system bus interface. The system bus interface utilizes the phase-shifted clocking signal as a timing signal to adjust the special sample format signal and drive the modified special sample format signal to the central processing unit.

The aforementioned operation is repeated a number of times. In this way, the core logic device is able to issue the central processing unit reset signal and add/subtract control signal repeatedly so that an optimum phase adjusting signal for the system bus interface is obtained.

This invention also provides a timing adjustment device for adjusting data timing signals sent from a central processing unit to a chipset. In the process of adjusting the system bus interface and as the chipset receives data timing signals from the central processing unit, a core logic device will start to assert a central processing unit reset signal to the central processing unit. Hence, the central processing unit is restarted. An add/subtract control signal is sent to the add/subtract device so that the add/subtract device increases or decreases phase adjusting signals accordingly.

On receiving the phase adjusting signal and an internal clocking signal (CLK), a phase lock loop device shifts the internal clocking signal according to the phase adjusting signal. Thereafter, the phase lock loop device outputs the phase-shifted clocking signal to the system bus interface.

When the central processing unit is restarted, the central processing unit outputs a result signal to the system bus interface. The system bus interface utilizes the phase-shifted clocking signal to drive the result signal so that the system bus interface is able to output special sample format signals to a special pattern device.

In the process of adjusting the central processing bus interface and as the chipset begins to receive data from the central processing unit, the cycle protocol device will generate special timing cycles and then outputs expected timing signals to the special pattern device. The special pattern device receives the special sample format signal from the system bus interface during the special timing cycles.

The aforementioned operation is repeated a number of times. In this way, the core logic device is able to issue the central processing unit reset signal and the add/subtract control signal a number of times so that an optimum phase adjusting signal for the system bus interface is obtained.

This invention also provides a method for adjusting the timing relationship with a system bus interface. The method includes the following steps. A central processing unit reset signal is asserted to a central processing unit and then an add/subtract control signal is asserted to increase/decrease a phase adjusting signal. An internal clocking signal is shifted according to the phase adjusting signal and the phase-shifted clocking signal is output. A special sample format signal is sent to the system bus interface according to a special timing cycle. On receiving the phase-shifted clocking signal and the special sample format signal, the system bus interface adjusts the special sample format signal and drives the modified special sample format signal to the system bus interface according to the phase-shifted clocking signal.

If the phase-shifted clocking signal produces sub-optimal results, the central processing unit reset signal and an add/subtract control signal for increasing/decreasing the phase-shift signal is issued again. The above steps are repeated until a phase-shift signal that permits the system bus interface to operate at an optimum condition is found.

This invention also provides a method for adjusting timing relationship with a system bus interface. The method includes the following steps. A central processing unit reset signal is asserted to a central processing unit and then a result signal is sent to the system bus interface. An add/subtract control signal is asserted to increase/decrease a phase adjusting signal. An internal clocking signal is shifted according to the phase adjusting signal and the phase-shifted clocking signal is output. On receiving the phase-shifted clocking signal and a special sample format signal, the system bus interface adjusts the special sample format signal and drives the modified special sample format signal to the system bus interface according to the phase-shifted clocking signal. At this stage, the special sample format signal from the system bus interface can be received according to special timing cycles. If the phase-shifted clocking signal produces sub-optimal results, a central processing unit reset signal and an add/subtract control signal for increasing/decreasing the phase-shift signal is issued again. The above steps are repeated until a phase-shift signal that permits the system bus interface to operate at an optimum condition is found.

This invention also provides a control chipset that includes a first control chip and a second control chip connected via a bus. The first and the second control chips each have a chip bus interface for latching and buffering signals between the first and the second control chip. The first control chip further includes a timing adjustment device coupled to the chip bus interface within the first control chip for controlling the chip bus interface and adjusting the timing of the signals between the first control chip and the bus. The timing adjustment device includes a cycle protocol device, a special pattern device, an add/subtract device and a phase lock loop device. The second control chip further includes a special pattern comparator/generator.

In the process of adjusting the timing between the first control chip and the chip bus interface, the cycle protocol device generates a special timing cycle so that an expected timing signal is output. The special pattern device is coupled to the cycle protocol device and the chip bus interface of the first control chip for receiving the expected timing signal so that a special sample format signal is output to the chip bus interface of the first control chip during the special timing cycle. The add/subtract device serves to increase/decrease a phase adjusting signal. The phase lock loop device is coupled to the add/subtract device and the chip bus interface of the first control chip for receiving the phase adjusting signal and shifting an internal clocking signal. The phase lock loop device shifts the internal clocking signal according to the phase adjusting signal and then outputs a phase-shifted clocking signal. According to the phase-shifted clocking signal, the chip bus interface of the first control chip is able to adjust the special sample format signal and drive the modified special sample format signal to the bus.

The special pattern comparator is coupled to the chip bus interface of the second control chip. In the process of adjusting the chip bus interface of the first control chip, the first control chip repeatedly increases/decreases the phase adjusting signal and asserts the changed phase adjusting signal. Consequently, the chip bus interface of the first control chip repeatedly adjusts the special sample format signal and drives the modified special sample format signal to the bus. Meanwhile, the chip bus interface of the second chip receives a signal from the bus and determines if the signal and the special sample format signal are identical or in error through the special pattern comparator. Ultimately, an optimal phase-shifting signal for operating the chip bus interface of the first control chip is obtained.

This invention also provides a method for adjusting the timing signals of a chip bus interface inside a first control chip. The chip bus interface is coupled to the bus and the bus is coupled to a second control chip. The second control chip includes a chip bus interface. The timing adjusting method includes the following steps. First, a phase adjusting signal is asserted to shift an internal clocking signal and then the phase-shifted clocking signal is output. According to a special timing cycle, a first special sample format signal is input into the chip bus interface of the first control chip. The chip bus interface of the first control chip adjusts the first special sample format signal and then drives the modified first special sample format signal to the bus according to the phase-shifted clocking signal. Thereafter, the chip bus interface of the second control chip receives signals on the bus and determines if the correct first special sample format signal is received. The phase adjusting signal is increased/decreased and then the modified phase adjusting signal is assertted to find the optimum phase adjusting signal for operating the chip bus interface.

The aforementioned timing adjustment method mainly adjusts the timing signal for sending data from the first control chip to the second control chip. In a similar way, the adjustment of the timing signal for the transfer of data from the second control chip to the first control chip includes the following steps. According to a special timing cycle, the chip bus interface of the second control chip drives a second special sample format signal to the bus. Meanwhile, the chip bus interface of the first control chip adjusts and latches the signals on the bus according to the phase-shifted clocking signal. The first control chip conducts a comparison test to determine if the correct second special sample format signal is received.

This invention also provides a north bridge control chip coupled to a south bridge control chip through a bus. The north bridge control chip includes a chip bus interface and a timing adjustment device. The chip bus interface is coupled to the bus for latching and buffering the signals moving between the north bridge control chip and the south bridge control chip. The timing adjustment device is coupled to the chip bus interface for controlling the chip bus interface and adjusting the timing of the communication signals between the north bridge control chipset and the bus. The timing adjustment device of this invention at least includes a cycle protocol device, a special pattern device, an add/subtract device and a phase lock loop device.

The cycle protocol device generates a special timing cycle for outputting an expected timing signal when the timing signal at the chip bus interface of the north bridge control chip is adjusted. The special pattern device is coupled to the cycle protocol device and the chip bus interface of the north bridge control chip for receiving the expected timing signal. Hence, a special sample format signal from the chip bus interface of the north bridge control chip is received during the special timing cycle. The add/subtract device increases/decreases a phase adjusting signal. The phase lock loop device is coupled to the add/subtract device and the chip bus interface of the north bridge control chip for receiving the phase adjusting signal and an internal clocking signal. The phase lock loop device shifts the internal clocking signal according to the phase adjusting signal and outputs a phase-shifted clocking signal. The chip bus interface of the north bridge control chip adjusts and drives the signal on the bus according to the phase-shifted clocking signal to produce the special sample format signal.

In the process of adjusting the chip bus interface of the north bridge control chip, the north bridge control chip repeatedly increases/decreases the phase adjusting signal and then asserts the changed phase adjusting signal. Hence, the chip bus interface of the north bridge control chip is able to adjust and drive the signal on the bus multiple times. According to the correctness of the special sample format signal received by the chip bus interface of the north bridge control chip, an optimal phase adjusting signal for operating the chip bus interface of the north bridge control chip is found.

This invention also provides a memory controller coupled to a memory bus. The memory bus is coupled to a memory unit. The memory controller includes a memory initialization device, a memory bus interface and a timing adjustment device. The timing adjustment device further includes a cycle protocol device, a special pattern device, a first add/subtract device, a second add/subtract device, a first phase lock loop device and a second phase lock loop device.

The memory initialization device is coupled to the memory bus for initializing the memory unit. The memory unit must go through an initialization procedure before the memory unit can operate normally. The memory bus interface is coupled to the memory bus for latching and buffering the communication signals between the memory controller and the memory unit. The timing adjustment device is coupled to the memory bus interface for controlling the memory bus interface and adjusting the timing of the communication signals between the memory controller and the memory bus.

The cycle protocol device within the timing adjustment device generates a special timing cycle for outputting an expected timing signal when adjusting the timing of the memory bus interface. The special pattern device is coupled to the cycle protocol device and the memory bus interface for receiving the expected timing signal from the cycle protocol device. Hence, in the special timing cycle, a first special sample format signal is sent to the memory bus interface and, in the meantime, a second special sample format signal is picked up from the memory bus interface.

The first and the second add/subtract device increase/decrease and generate a first and a second phase adjusting signal respectively. The first phase lock loop device is coupled to the first add/subtract device and the memory bus interface for receiving the first phase adjusting signal and an internal clocking signal. According to the first phase adjusting signal, the first phase lock loop device shifts the internal clocking signal to output a first phase-shifted clocking signal. The memory bus interface drives the first special sample format signal to the memory bus. According to the first phase-shifted clocking signal, the second phase lock loop device is coupled to the second add/subtract device and the memory bus interface for receiving the second phase adjusting signal and the internal clocking signal. The second phase lock loop device shifts the internal clocking signal to output a second phase-shifted clocking signal according to the second phase adjusting signal. According to the second phase-shifted clocking signal, the memory bus interface adjusts and drives the signal on the memory bus to produce the second special sample format signal.

The first and the second add/subtract device repeatedly increase/decrease and assert the first phase adjusting signal and the second phase adjusting signal. Through a comparison of the received first special sample format signal and the second special sample format signal, an optimal phase adjusting signal for operating the memory bus interface is found.

This invention also provides a method for adjusting the timing of a memory controller. The memory controller has a memory bus interface coupled to a memory bus. The memory bus is coupled to a memory unit. The timing adjustment method includes the following steps. First, the memory unit is initialized and then a phase adjusting signal is issued. According to the phase adjusting signal, an internal clocking signal is shifted to produce a phase-shifted clocking signal. A first special sample format signal is input into the memory bus interface according to a special timing cycle. According to the phase-shifted clocking signal, the memory bus interface drives the first special sample format signal to the memory bus and then the memory bus interface receives the signal on the memory bus to generate a second special sample format signal. The second special sample format signal from the memory bus interface is received according to the special timing cycle. The first special sample format signal and the second special sample format signal are compared. Finally, the phase adjusting signal is increased/decreased and re-asserted a number of times to find the optimal phase adjusting signal for operating the memory bus interface.

The timing adjustment device and method for a bus interface according to this invention may eliminate system instability resulting from inappropriate layout design. Since there is no need to re-route a circuit board or re-fabricate a bus interface, production cost and some re-working time is saved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
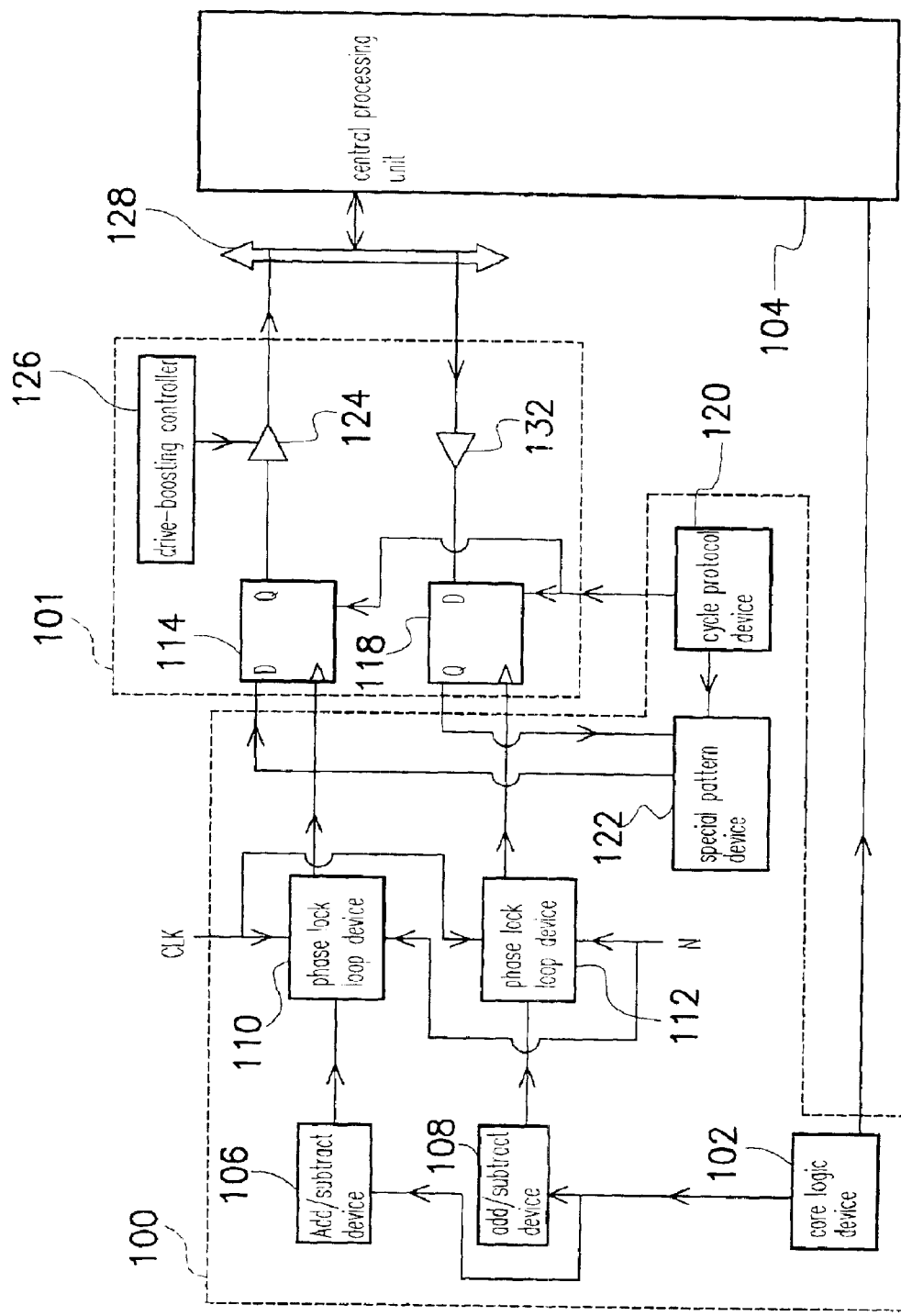
FIG. 1 is a schematic diagram showing a timing adjustment device for a system bus interface according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram showing a timing adjustment device for a system bus interface according to a first preferred embodiment of this invention. The system in FIG. 1 mainly includes a timing adjustment device 100 and a system bus interface 101, both of which are incorporated inside a control chipset. The control chipset and a central processing unit 104 are connected together through a system bus 128.

The timing adjustment device 100 farther includes a core logic device 102, two add/subtract devices 106 and 108, two phase lock loop devices 110 and 112, a special pattern device 122 and a cycle protocol device 120. The special pattern device 122 is coupled to the cycle protocol device 120 and the system bus interface 101. The phase lock loop device 110 is coupled to the add/subtract device 106 and the system bus interface 101. The phase lock loop device 112 is coupled to the add/subtract device 108 and the system bus interface 101. The core logic device 102 is coupled to the central processing unit 104 and the pair of add/subtract devices 106 and 108.

The system bus interface 101 further includes two latching devices 114 and 118, two buffers 124 and 132 and a drive-boosting controller 126. The latching device 114 is coupled to the special pattern device 122 and the phase lock loop device 120. The latching device 118 is coupled to the special pattern device 122 and the phase lock loop device 120. The buffer 124 couples with both the latching device 114 and the drive-boosting controller 126. The buffer 132 couples with the latching device 118.

In the process of adjusting the system bus interface 101 and as the chipset transmits timing signals to the central processing unit 104, the core logic device 102 will assert a central processing unit reset signal to the central processing unit 104. Thus, the central processing unit 104 is restarted. After restarting, the central processing unit 104 executes special command timing signals, for example, reading an instruction from a fixed address location. The special pattern device 122 asserts a series of no operation (NOP) instruction codes during a special timing cycle under the control of the cycle protocol device 120. Since the central processing unit 104 will continue to read instructions from the next address if the NOP instruction codes are received correctly, the special pattern device 122 may compare the result signals and determine if the currently set timing permits normal operation or not.

In the process of adjusting the system bus interface 101 and as the chipset transmits data timing signals to the central processing unit 104, the cycle protocol device 120 will generate a special timing cycle simultaneously and output an expected timing signal to the special pattern device 122. On receiving the expected timing signal, the special pattern device 122 outputs a special sample format signal to the latching device 114 of the system bus interface 101 according to the special timing cycle. For example, the cycle protocol device 120 may set the special timing cycle to be two clock cycles and the special pattern device 122 will output the special sample format signal to the latching device 114 of the system bus interface 101 every two clock cycles.

On the other hand, the core logic device 102 will assert an add/subtract signal to the add/subtract device 106. On receiving the add/subtract signal, the add/subtract device 106 increases/decreases a phase adjusting signal according to the add/subtract signal.

When the phase lock loop device 110 receives the phase adjusting signal and an internal clocking signal, the phase lock loop device 110 shifts the internal clocking signal according to the phase adjusting signal and a signal N and then outputs a phase-shifted clocking signal to the latching device 114 of the system bus interface 101. The latching device 114 of the system bus interface 101 uses the phase-shifted clocking signal as a timing signal for adjusting the special sample format signal and driving the modified special sample format signal to the buffer 124. Here, signal N is a number that decides the magnitude of phase shift in the internal clocking signal in each phase shift operation. For example, if N=3, the phase shift value internal clocking signal/$2^3$. Hence, the phase-shifted clocking signal=internal clocking signal+internal clocking signal/$2^3$.

When the buffer 124 receives a new special sample format signal, the drive-boosting controller 126 outputs a drive-boosting signal to control the driving capability of the buffer 124 and adjusts the slew rate at the rising edge and the falling edge of the new special sample format signal. Thereafter, the modified special sample format signal is sent to the central processing unit 104 via the system bus interface 128. Anyone familiar with the technology may utilize the increasing or decreasing magnitude of the drive-boosting controller 126 to find the optimal drive-boosting signal.

On receiving the new special sample format signal, the central processing unit 104 asserts the next address to the system bus 128, the buffer 132 and the latching device 118. The latching device 118 outputs a result signal to the special pattern device 122. The special pattern device 122 compares the received result signals and uses the correctness of the result signals to determine if the currently set timing signal is suitable for normal operation or not. If the currently set timing result signal permits a normal operation, the phase-shifted clocking signal is chosen as a reference point. The add/subtract device 106 is utilized to control the increase/decrease of the phase adjusting signal so that the phase-shifted clocking signal moves towards the left. The whole operation is repeated until the result signal received by the special pattern device 122 is in error. On returning to the reference point, the add/subtract device 106 again controls the increase/decrease of the phase adjusting signal so that the phase-shifted clocking signal moves towards the right. The whole operation is repeated until the result signal received by the special pattern device 122 is in error. The separation in timing for the two result signals in error is a safe range for shifting the phase-shifted clocking signal. For example, if N=3, the add/subtract device 106 increases the phase adjusting signal so that the phase-shifted clocking signal shifts towards the left until the phase adjusting signal is increased to 4. The special pattern device 122 receives a result signal in error and then returns to the reference point. Next, the add/subtract device 106 decreases the phase adjusting signal so that the phase-shifted clocking signal shifts towards the right until the phase-shifted clocking signal is reduced to 4. The special pattern device 122 receives a result signal in error. From the aforementioned description, safety operation range for the phase-shifted clocking signal can be determined to be $-4/2^3$ of the internal clocking signal to $4/2^3$ of the internal clocking signal. Here, 4 represents the overall phase shift value and 3 represents the phase-shift value of each phase shift. Anyone familiar with the technology may know that there are many different reference points and many phase shifting modes for finding the safe operating range for the phase-shifted clocking signal all within the scope of this invention.

This invention also provides a timing adjustment device for adjusting the timing of data transmitted from the central processing unit to the chipset within the system bus interface 101.

In the process of adjusting the system bus interface 101, as the chipset transmits timing signals to the central processing unit 104, the core logic device 102 will assert a central processing unit reset signal to the central processing unit 104. Thus, the central processing unit 104 is restarted. After restarting, the central processing unit 104 executes special command timing signals, for example, reading an instruction from a fixed address location. The special pattern device 122 asserts a series of no operation (NOP) instruction codes during a special timing cycle under the control of the cycle protocol device 120. Since the central processing unit 104 will continue to read instructions from the next address if the NOP instruction codes are received correctly, the special pattern device 122 may compare the result signals and determine if the currently set timing permits normal operation or not.

In the process of adjusting the system bus interface 101 and as the chipset transmits data timing signals to the central processing unit 104, the cycle protocol device 120 will generate a special timing cycle simultaneously and output an expected timing signal to the special pattern device 122. On receiving the expected timing signal, the special pattern device 122 outputs a special sample format signal to the central processing unit 104 via the latching device 114, the buffer 124 and the system bus interface 101 according to the special timing cycle. On receiving the special sample format signal, the central processing unit 104 outputs the next address to the latching device 118 via the buffer 132. For example, the cycle protocol device 120 may set the special timing cycle to be three clock cycles and the special pattern device 122 will output the special sample format signal to the latching device 114 of the system bus interface 101 every three clock cycles.

On the other hand, the core logic device 102 will assert an add/subtract signal to the add/subtract device 108. On receiving the add/subtract signal, the add/subtract device 108 increases/decreases a phase adjusting signal according to the add/subtract signal.

When the phase lock loop device 112 receives the phase adjusting signal and an internal clocking signal, the phase lock loop device 112 shifts the internal clocking signal according to the phase adjusting signal and a signal N. The phase lock loop device 112 then outputs a phase-shifted clocking signal to the latching device 118 of the system bus interface 101. Here, signal N is a number that decides the magnitude of phase shift in the internal clocking signal in each phase shift operation. For example, if N=3, the phase shift value=internal clocking signal/$2^3$. Hence, the phase-shifted clocking signal=internal clocking signal+internal clocking signal/$2^3$.

The latching device 118 of the system bus interface 101 uses the phase-shifted clocking signal as a timing signal to drive out the next address from the central processing unit 104 and generate a result signal. The result signal is transferred to the special pattern device 122.

On receiving the result signal, the special pattern device 122 utilizes the correctness of the received result signal to determine if the currently set timing signal is suitable for normal operation or not. If the currently set timing result signal permits a normal operation, the phase-shifted clocking signal is chosen as a reference point. The add/subtract device 108 is utilized to control the increase/decrease of the phase adjusting signal so that the phase-shifted clocking signal moves towards the left. The whole operation is repeated until the result signal received by the special pattern device 122 is in error. On returning to the reference point, the add/subtract device 108 again controls the increase/decrease of the phase adjusting signal so that the phase-shifted clocking signal moves towards the right. The whole operation is repeated until the result signal received by the special pattern device 122 is in error. The separation in timing for the two result signals in error is a safe operating range for the phase-shifted clocking signal. For example, if N=3, the add/subtract device 108 increases the phase adjusting signal so that the phase-shifted clocking signal shifts towards the left until the phase adjusting signal is increased to 4. The special pattern device 122 receives a result signal in error and then returns to the reference point. Next, the add/subtract device 108 decreases the phase adjusting signal so that the phase-shifted clocking signal shifts towards the right until the phase-shifted clocking signal is reduced to 4. The special pattern device 122 receives a result signal in error. From the aforementioned description, safety operation range for the phase-shifted clocking signal is determined to be $-4/2^3$ of the internal clocking signal to $4/2^3$ of the internal clocking signal. Here, 4 represents the overall phase shift value and 3 represents the phase-shift value of each phase shift. Anyone familiar with the technology may know that there are many different reference points and many phase shifting modes for finding the safe operating range for the phase-shifted clocking signal all within the scope of this invention.

In the first embodiment, these devices and interfaces are housed within a control chipset. Anyone familiar with such technology also knows that these devices and interfaces may also be considered to reside within the system bus interface of the control chipset.

Figure 2:
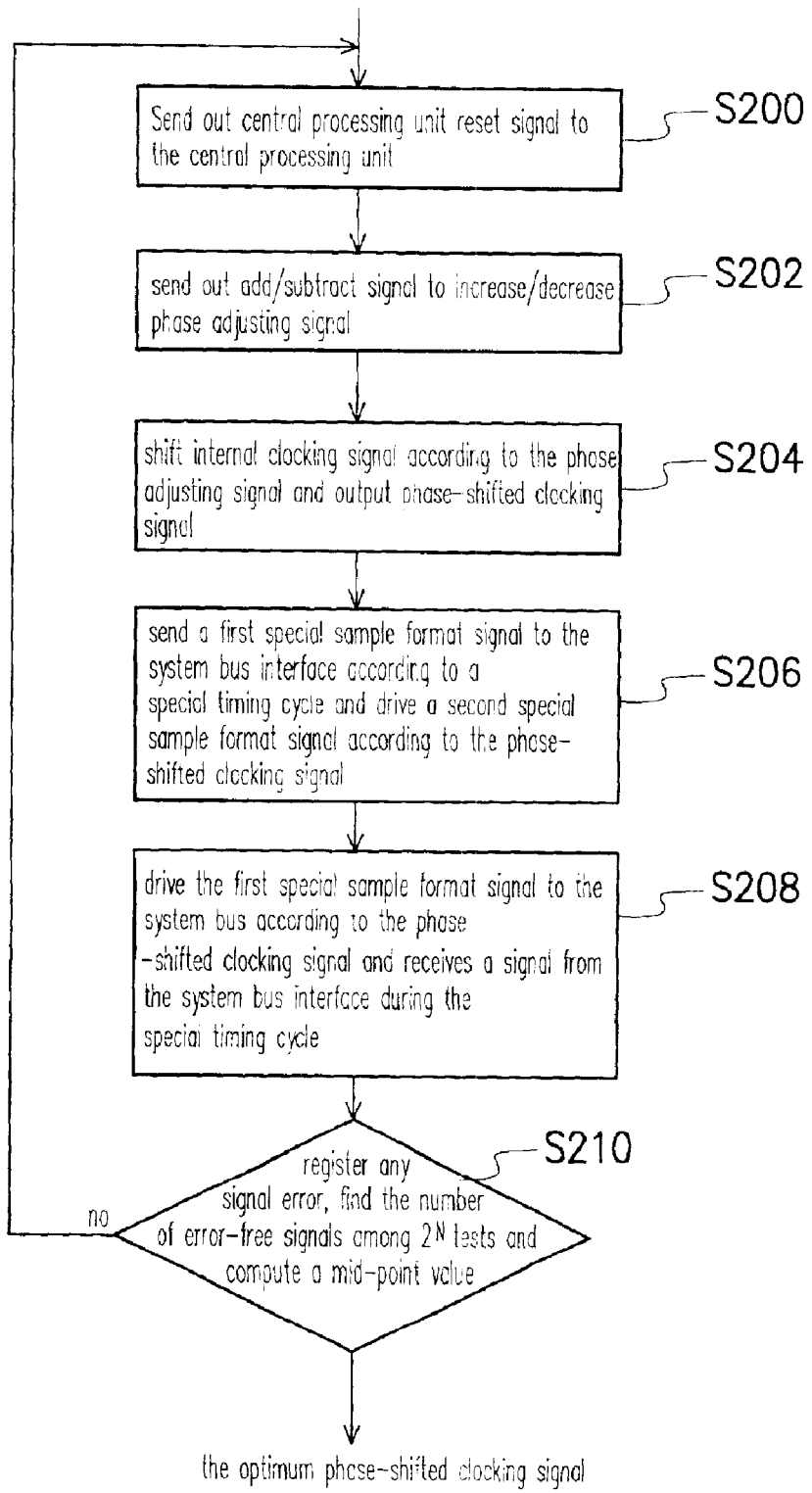
FIG. 2 is a flow chart showing the steps for adjusting the timing of a system bus interface according to the first preferred embodiment of this invention.

FIG. 2 is a flow chart showing the steps for adjusting the timing of a system bus interface according to the first preferred embodiment of this invention. This invention also provides a method of adjusting the timing of a system bus interface, where the system bus interface is coupled to the system bus and the system bus is coupled to the central processing unit.

In step S200, a central processing unit reset signal is asserted to the central processing unit. In step S202, the add/subtract control signal is used to control the increase/decrease of phase adjusting signal. In step S204, the internal clocking signal is shifted according to the phase adjusting signal so that a phase-shifted clocking signal is produced. In step S206, the first special sample format signal is sent to the system bus interface according to a special timing cycle. According to the phase-shifted clocking signal, the system bus interface adjusts and drives the result signal from the system bus interface so that the second special sample format signal is produced. In step S208, the system bus interface adjusts and drives the first special sample format signal to the system bus according to the phase-shifted clocking signal. The system bus receives the second special sample format signal from the system bus interface according to the special timing cycle. In step S210, correctness of received signals is recorded. Among the $2^N$ tests, the number of error free signals and values is found and the mid-point of these values is used as a reference. Step S210 mainly serves to determine the optimum phase-shifted clocking signal. If the optimum phase-shifted clocking signal is not yet found, step S200 is executed again so that another central processing unit reset signal and add/subtract control signal for increasing/decreasing the phase adjusting signal are asserted. The aforementioned steps are repeated. According to the response of the signal sender and receiver, error free signal values are obtained and averaged to find the optimal phase adjusting signal for operating the system bus interface.

Figure 3:
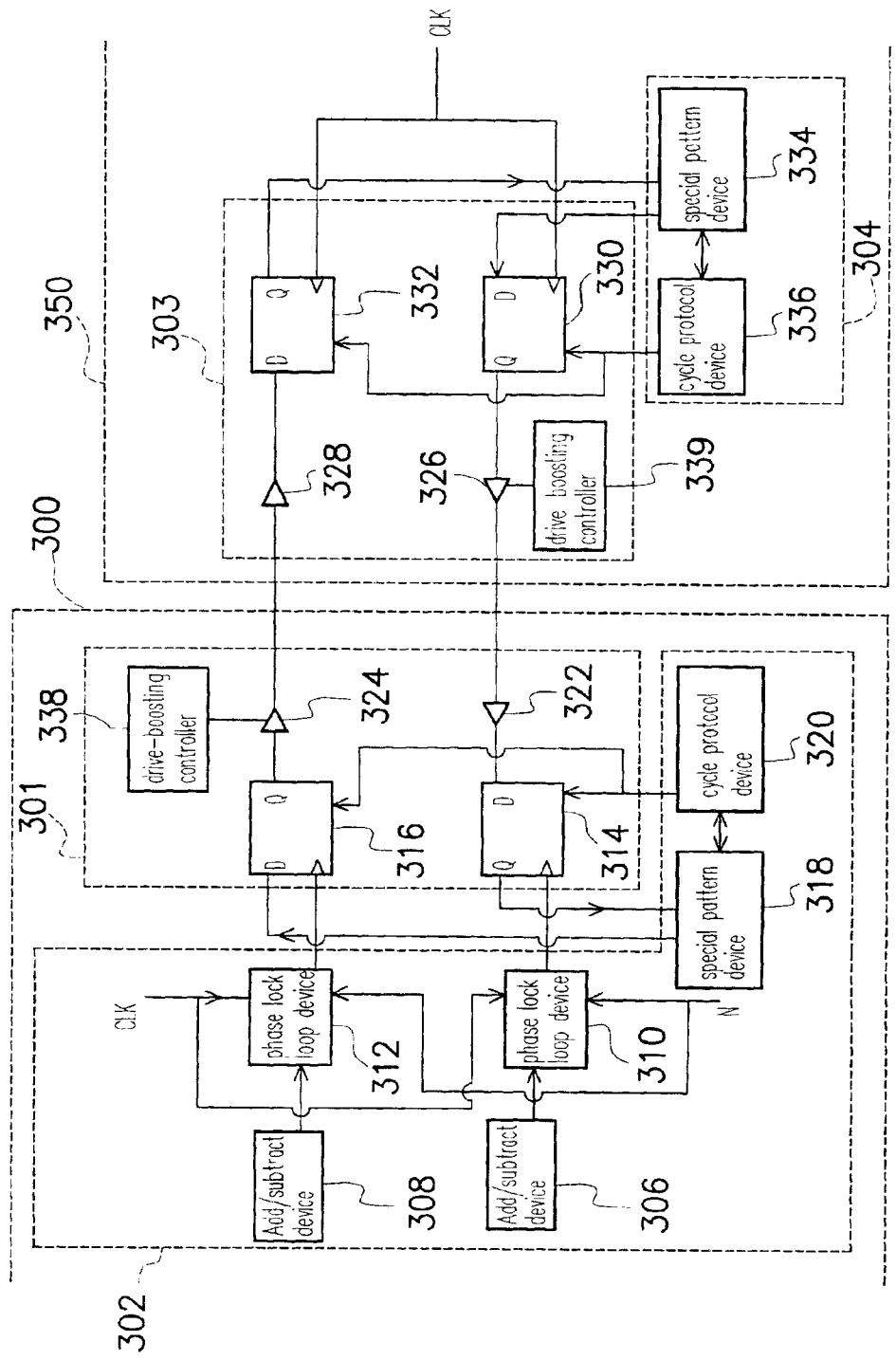
FIG. 3 is a schematic diagram showing a control chipset connection system according to a second preferred embodiment of this invention.

FIG. 3 is a schematic diagram showing a control chipset connection system according to a second preferred embodiment of this invention. The control chipset connection system includes two adjustment devices 302 and 304 and two chip bus interfaces 301 and 303. In the second embodiment, the adjustment device 302 and the chip bus interface 301 belong to a north bridge control chip 300. The chip bus interface 301 is coupled to the chip bus interface 303 through a inter-chipbus. The adjustment device 304 is coupled to the chip bus interface 303. In this embodiment, the adjustment device 304 and the chip bus interface 303 belong to a south bridge control chip 350. The north bridge control chip 300 and the south bridge control chip 350 together constitute a control chipset.

The adjustment device 302 further includes two add/subtract devices 306 and 308, two phase lock loop devices 310 and 312, a special pattern device 318 and a cycle protocol device 320. The special pattern device 318 is coupled to the cycle protocol device 320 and the chip bus interface 301. The phase lock loop device 310 is coupled to the add/subtract device 306 and the chip bus interface 301. The phase lock loop device 312 is coupled to the add/subtract device 308 and the chip bus interface 301.

The chip bus interface 301 further includes two latching devices 314 and 316, two buffers 322 and 324 and a drive-boosting controller 338. The latching device 316 is coupled to the special pattern device 318 and the phase lock loop device 312. The latching device 314 is coupled to the special pattern device 318 and the chip bus interface 303. The buffer 322 is coupled to the latching device 318 and the chip bus interface 303.

The chip bus interface 303 further includes two latching devices 332 and 330, two buffers 328 and 326 and a drive-boosting controller 339. The latching device 332 is coupled to a special pattern device 334 and the buffer 328. The latching device 330 is coupled to the special pattern device 334 and the buffer 326. The drive-boosting controller 339 is coupled to the buffer 326. The buffer 328 is coupled to the buffer 324 and the buffer 326 is coupled to the buffer 322.

The adjustment device 304 further includes the special pattern device 334 and a cycle protocol device 336. The special pattern device 334 is coupled to the cycle protocol device 336 and the latching devices 332 and the latching device 330 inside the chip bus interface 303.

The operational method is like the procedure shown in FIG. 2 for adjusting the timing of the system bus interface.

In the second embodiment, the north bridge control chip is a main control chip while the south control chip is a slave control chip. The timing adjustment device and method mainly operate on the main control chip (that is, the north control chip). However, anyone familiar with the technology knows that the south bridge can be the main control chip while the north bridge control chip can be the slave control chip. In other words, the south bridge is the target of the timing adjustment.

Figure 4:
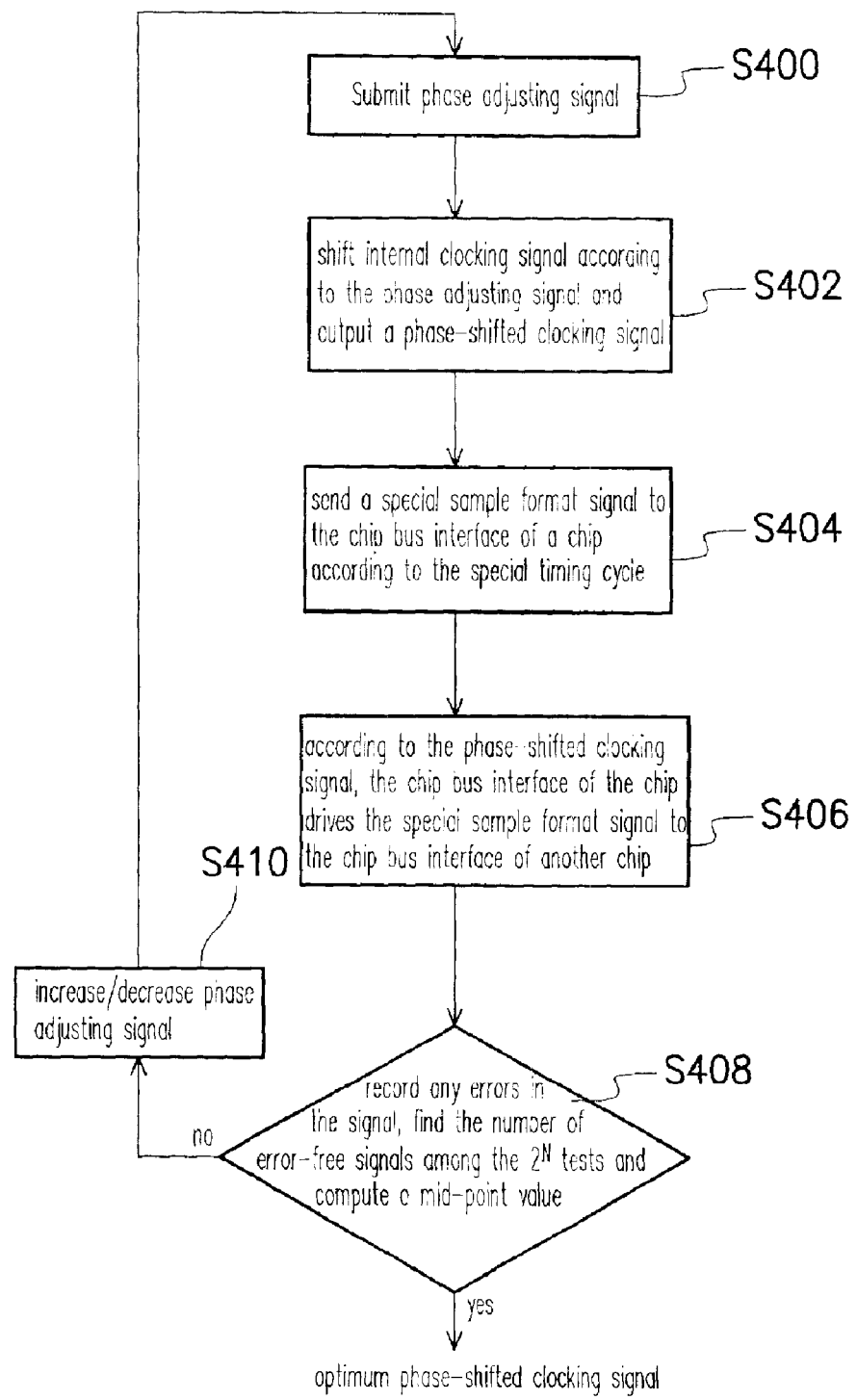
FIG. 4 is a flow chart showing the steps for adjusting the control chipset connection system according to the second preferred embodiment of this invention.

According to the devices and flow, a method for adjusting the timing of read-out data and the timing of write-in data is evident. FIG. 4 is a flow chart showing the steps for adjusting the control chipset connection system according to the second preferred embodiment of this invention. The timing adjustment method according to this embodiment is used for adjusting the timing of a chip bus interface of a first control chip. The chip bus interface is coupled to a bus and the bus is coupled to a second control chip. The second control chip further includes a chip bus interface. The timing adjustment method includes the following steps.

In step S400, a phase adjusting signal is asserted. In step S402, an internal clocking signal is shifted according to the phase adjusting signal and then the phase-shifted clocking signal is output. In step S404, a first special sample format signal is sent to the chip bus interface of the first control chip according to a special timing cycle. When the chip bus interface of the first control chip receives the phase-shifted clocking signal and the special sample format signal, step S406 is executed. In step S406, the chip bus interface of the first control chip drives the special sample format signal and outputs the signal to the chip bus interface of another chip (the second control chip) according to the phase-shifted clocking signal.

In step S408, the chip bus interface of the second control chip receives signals on the bus. The second control chip compares to check if the first special sample format signal is correctly received. Step S410 is repeated a number of times so that the phase adjusting signal is increased/decreased and output so that the optimal phase adjusting signal for operating the chip bus interface is found. In other words, the best phase-shifted clocking signal is determined in step S408. If the best phase-shifted clocking signal is not available yet, step S410 is executed again to increase/decrease phase shifting signal and the entire process is repeated until an optimum phase adjusting signal for operating the chip bus interface is obtained.

Anyone familiar with the technology may notice that the timing adjustment method may also use the chip bus interface of the second control chip according to a special timing cycle to drive the second special sample format signal to the bus. The chip bus interface of the first control chip may adjust and latch the signal on the bus according to the phase-shifted clocking signal. The first control chip compares to determine if the second special sample format signal is correctly received. The phase adjusting signal is increased/decreased and output repeatedly a number of times so that the optimum phase adjusting signal for operating the chip bus interface is obtained.

Figure 5:
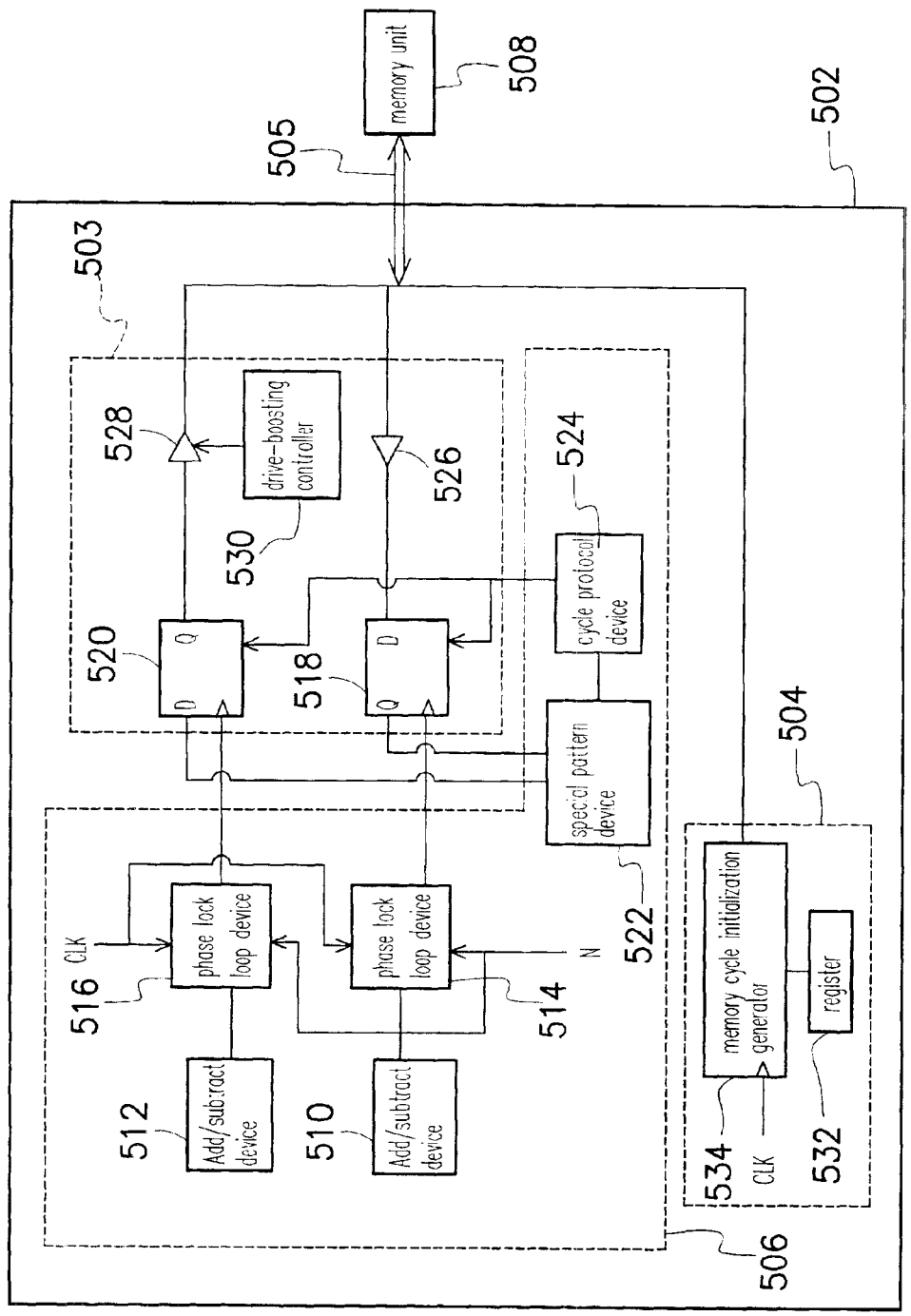
FIG. 5 is a schematic diagram showing a memory controller according to a third preferred embodiment of this invention.

FIG. 5 is a schematic diagram showing a memory controller according to a third preferred embodiment of this invention. As shown in FIG. 5, the memory controller 502 includes a timing adjustment device 506, a memory bus interface 503 and an initialization device 504.

The adjustment device 506 further includes two add/subtract devices 510 and 512, two phase lock loop devices 514 and 516, a special pattern device 522 and a cycle protocol device 524. The special pattern device 522 is coupled to the cycle protocol device 524 and the memory bus interface 503. The phase lock loop device 516 is coupled to the add/subtract device 512 and the memory bus interface 503. The phase lock loop device 514 is coupled to the add/subtract device 510 and the memory bus interface 503.

The memory bus interface 503 further includes two latching devices 518 and 520, two buffers 526 and 528 and a drive-boosting controller 530. The latching device 520 is coupled to the special pattern device 522 and the phase lock loop device 516. The latching device 518 is coupled to the special pattern device 522 and the phase lock loop device 514. The buffer 528 is coupled to the latching device 520 and the drive-boosting controller 530 and the buffer 526 is coupled to the latching device 524.

The initialization device 504 further includes a memory cycle initialization generator 534 and a register 532. The memory cycle initialization generator 534 is coupled to the register 532 and the memory bus 505.

On switching the system on, the memory cycle initialization generator 524 of the initialization device 504 automatically reads off data from a serial program device (SPD) inside a memory unit 508 and transfers the data to the register 532. Anyone familiar with the technology may know that this method may also be applied to a portable computer. However, because the memory addresses of the SPD are identical, a two-to-one multiplexer is needed to conduct the switching of the memory bus 505 so that SPD data from different memory locations can be stored.

The initialization device 504 sets up cycles for the memory during the initialization stage according to the data stored inside the register 532. Anyone familiar to with the technology may know that these cycles are generated according to a fixed sequence based on memory specification.

After performing the initialization, timing of the signals for writing data from the memory bus interface 503 to the memory 508 is adjusted. In the process of adjusting the writing of data from the memory bus interface 503 into the memory unit 508, the cycle protocol device 524 will generate a special timing cycle and output an expected timing signal to the special pattern device 522. On receiving the expected timing signal, the special pattern device 522 outputs a special sample format signal to the latching device 520 of the memory bus interface 503 according to the special timing cycle. The special sample format signal provided by the special pattern device 522 triggers the storage of special data in a special memory address. Thereafter, the memory unit 504 is activated so that special data is output from the special memory address. For example, if the special timing cycle of the cycle protocol device 524 is set to two clock cycles, the special pattern device 522 will output special sample format signal to the latching device 520 of the memory bus interface 503 after every two timing cycles.

In the meantime, the add/subtract device 512 outputs a phase adjusting signal to the phase lock loop device 516. On receiving the phase adjusting signal and an internal clocking signal, the phase lock loop device 516 shifts the internal clocking signal according to the phase adjusting signal and a signal N and then outputs a phase-shifted clocking signal to the latching device 520 of the memory bus interface 503. The latching device 520 of the memory bus interface 503 uses the phase-shifted clocking signal as a timing signal to drive the special sample format signal and produce adjusted special sample format signal. The adjusted special sample format signal is sent to the buffer 528. Here, signal N is a number that decides the magnitude of phase shift in the internal clocking signal in each phase shift operation. For example, if N=3, the phase shift value=internal clocking signal/$2^3$. Hence, the phase-shifted clocking signal=internal clocking signal+internal clocking signal/$2^3$.

When the buffer 528 receives the adjusted special sample format signal, the drive-boosting controller 530 outputs a drive-boosting signal to control the driving capability of the buffer 528 so that the slew rate of the rising edge and the falling edge of the new special sample format signal is adjusted. The adjusted new special sample format signal is transmitted to the memory unit 508 through the memory bus 505. Anyone familiar with the technology may utilize the increasing or decreasing magnitude of the drive-boosting controller 530 to find the optimal drive-boosting signal.

After the memory unit 508 has received the adjusted special sample format signal, the adjusted special sample format signal triggers the storage of the special data in a special memory address. Thereafter, the memory unit 508 transfers the special data in the special memory address to the special pattern device 522 via the buffer 526 and the latching device 518. Anyone familiar with the technology may know that the latching device 518 uses the internal clocking signal as a timing signal to drive the signals on the memory bus to the special pattern device 522. For example, after the memory unit 508 has received the adjusted special sample format signal, special data FF is transferred to the memory address 3FFF. The special data FF is read out from the address 3FFF and then the special data FF is transferred to the memory bus as signals. After going through the buffer 526 and the latching device 518, the special data is converted into another special sample format signal and transferred to the special pattern device 522.

The special pattern device 522 compares the asserted special sample format signal and the received special sample format signal to find any errors and determine if the currently set timing permits a normal operation or not. If the currently set timing signal permits normal operation, the phase-shifted clocking signal is taken as a reference point. The add/subtract device 512 controls the increase/decrease of the phase adjusting signal so that the phase-shifted clocking signal shifts towards the left. The aforementioned steps are repeated until the special sample format signal received by the special pattern device 522 is in error. On returning to the reference point, the add/subtract device 512 is again utilized to control the increase/decrease of the phase adjusting signal so that the phase-shifted clocking signal shifts towards the right. The above steps are repeated until the special sample format signal received by the special pattern device 522 is again in error. The separation in timing signal between the second special sample format signals in error constitutes a safety range for shifting the phase-shifted clocking signal. For example, if N=3, the add/subtract device 512 increases the phase adjusting signal so that the phase-shifted clocking signal shifts towards the left until the phase adjusting signal is increased to 4. The special pattern device 522 receives a special sample format signal in error and then returns to the reference point. Next, the add/subtract device 512 decreases the phase adjusting signal so that the phase-shifted clocking signal shifts towards the right until the phase-shifted clocking signal is reduced to 4. The special pattern device 522 receives a special sample format signal in error. From the aforementioned description, safety operation range for the phase-shifted clocking signal is determined to be $-4/2^3$ of the internal clocking signal to $4/2^3$ of the internal clocking signal. Here, 4 represents the overall phase shift value and 3 represents the phase-shift value of each phase shift. Anyone familiar with the technology may know that there are many different reference points and many phase shifting modes for finding the safe operating range for the phase-shifted clocking signal all within the scope of this invention.

The operational method is like the procedure shown in FIG. 2 for adjusting the timing of the system bus interface.

Figure 6:
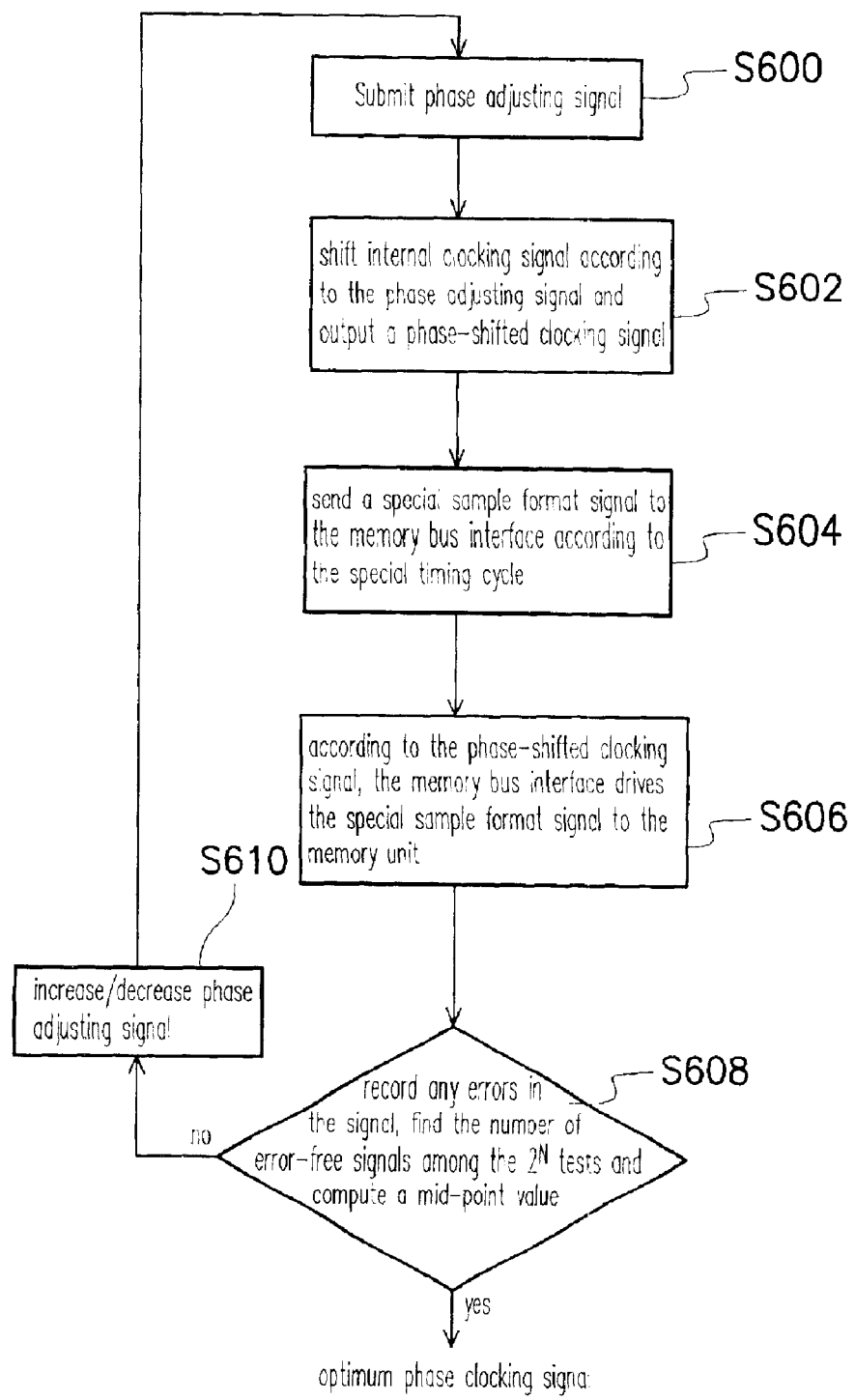
FIG. 6 is a flow chart showing the steps for adjusting the timing of the memory controller according to the third preferred embodiment of this invention.

FIG. 6 is a flow chart showing the steps for adjusting the timing of the memory controller according to the third preferred embodiment of this invention. The method for adjusting the timing signal of a memory controller includes the following steps. First, memory (not shown) is initialized so that the memory unit 508 starts to operate normally. For example, the memory initialization device 504 is used for this initialization step. In step S600, a phase adjusting signal is asserted. The phase adjusting signal is increased/decreased and re-asserted a number of times to adjust the timing signal. In step S602, an internal clocking signal is shifted according to the phase adjusting signal and then the phase-shifted clocking signal is output. In step S604, a first special sample format signal is sent to the memory bus interface 503 according to a special timing cycle. In step S606, the memory bus interface 503 drives the first special sample format signal to the memory bus 505 according to the phase-shifted clocking signal.

The memory unit 508 sends the special data to a special memory address according to the first special sample format signal. Thereafter, the memory unit 508 is triggered to send the special data in the special memory address to the memory bus. According to the phase-shifted clocking signal, the memory bus interface picks up signals from the memory bus to produce a second special sample format signal (not shown). In steps S608 and S610, the first special sample format signal and the second special sample format signal are compared to record any incorrect signals. The process of increasing/decreasing the phase adjusting signal and re-asserting the signal is repeated a number of times. Among the $2^N$ tests, the number of times having error free signals is recorded. For example, using the mid-value as a principle point, the optimum phase adjusting signal or phase-shifted clocking signal for operating the memory bus interface is found.

This invention utilizes the shifting of clocking signal to rectify timing deviations due to defective chip design, CPU design, PCB layout design and SMT. Using the type of timing control provided by this invention, it is possible to integrate various devices together even if they have timing mismatch. Since there is no need to re-design the layout of circuit board or to re-fabricate bus interface due to timing mismatch, production cost and re-working time is saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A timing adjustment device for adjusting the timing at a bus interface and preventing any read/write error due to timing deviation, the adjustment device comprising:
   a cycle protocol device for generating a special read/write cycle signal that links up with devices having connection with the bus interface;
   a phase lock loop device coupled to the bus interface for receiving an internal clocking signal, increasing/ decreasing the amount of phase shift in the internal clocking signal to become a clocking signal for the bus interface to drive a special read/write test sample to a bus and trigger the reception of data on the bus;

a special pattern device coupled to the cycle protocol device, wherein the special pattern device generates the special read/write test samples according to the special read/write cycle signal to provide read/write tests of the bus interface and check the bus interface for the correctness of data read/write operation; and an add/subtract device coupled to the phase lock loop device for setting the amount of phase shift in the phase lock loop device.

2. The timing adjustment device of claim 1, wherein the phase lock loop device further receives a signal N for setting the phase shift resolution of the amount of phase shift in the phase lock loop device.

3. A timing adjustment device for a system bus interface, wherein the system bus interface is coupled to a system bus and the system bus is coupled to a central processing unit (CPU), the timing adjustment device comprising:

a cycle protocol device for outputting a timing adjusting signal to adjust the system bus interface;

a special pattern device coupled to the cycle protocol device and the system bus interface for sending a special sample format signal to the system bus interface during the special timing cycle in response of the timing adjusting signal;

an add/subtract device for outputting a phase signal according to an add/subtract signal;

a phase lock loop device coupled to the add/subtract device and the system bus interface for receiving the phase signal and an internal clocking signal, wherein the phase lock loop device shifts the internal clocking signal according to the phase signal, and outputs a phase-shifted clocking signal; and a core logic device coupled to the central processing unit and the add/subtract device for sending a central processing unit reset signal to the central processing unit and asserting the add/subtract control signal when adjusting the system bus interface;

wherein the system bus interface adjusts and drives the special sample format signal to the system bus interface according to the phase-shifted clocking signal.

4. The timing adjustment device of claim 3, wherein the core logic device also asserts the central processing unit reset signal and add/subtract control signal repeatedly a number of times to obtain the optimum phase signal for operating the system bus interface.

5. The timing adjustment device of claim 3, wherein the system bus interface further comprises:

a latching device coupled to the special pattern device and the phase lock loop device for registering the special sample format signal and using the phase-shifted clocking signal as a timing signal to drive the latching device so that the latching device outputs an adjusted special sample format signal; and a buffer coupled to the latching device for receiving the adjusted special sample format signal, boosting the current of the adjusted special sample format signal and sending the adjusted special sample format signal to the central processing unit.

6. The timing adjustment device of claim 5, wherein the central processing unit interface further comprises:

a drive-boosting controller coupled to the buffer for outputting a drive-boosting signal and controlling the driving capability of the buffer.

7. The timing adjustment device of claim 3, wherein the phase lock loop device further receives a signal N for determining the phase value in each shifting of the internal clocking signal.

8. A control chipset coupled to a central processing unit via a system bus, comprising:

a system bus interface coupled to the system bus for latching and buffering the signals between the control chipset and the central processing unit; and a timing adjustment device coupled to the system bus interface for controlling the system bus interface, adjusting the timing of signal between the control chipset and the system bus, the timing adjustment device further comprising:

a cycle protocol device for outputting a timing adjusting signal to adjust the system bus interface;

a special pattern device coupled to the cycle protocol device and the system bus interface for sending a special sample format signal to the system bus interface during the special timing cycle in response of the timing adjusting signal;

an add/subtract device for outputting a phase signal according to an add/subtract signal;

a phase lock loop device coupled to the add/subtract device and the system bus interface for receiving the phase signal and an internal clocking signal, wherein the phase lock loop device shifts the internal clocking signal according to the phase signal, and outputs a phase-shifted clocking signal; and a core logic device coupled to the central processing unit and the add/subtract device for sending a central processing unit reset signal to the central processing unit and asserting the add/subtract control signal when adjusting the system bus interface;

wherein the system bus interface adjusts and drives the special sample format signal to the system bus according to the phase-shifted clocking signal.

9. The control chipset of claim 8, wherein the core logic device also asserts the central processing unit reset signal and add/subtract control signal repeatedly a number of times to obtain the optimum phase signal for operating the system bus interface.

10. The control chipset of claim 8, wherein the system bus interface further comprises:

a latching device coupled to the special pattern device and the phase lock loop device for registering the special sample format signal and using the phase-shifted clocking signal as a timing signal to drive the latching device so that the latching device outputs an adjusted special sample format signal; and a buffer coupled to the latching device for receiving the adjusted special sample format signal, boosting the current of the adjusted special sample format signal and sending the adjusted special sample format signal to the central processing unit.

11. The control chipset of claim 10, wherein the system bus interface further comprises:

a drive-boosting controller coupled to the buffer for outputting a drive-boosting signal and controlling the driving capability of the buffer.

12. A method of adjusting the timing of a system bus interface, wherein the system bus interface is coupled to a system bus and the system bus is coupled to a central processing unit, the method comprising the steps of:

sending a central processing unit reset signal to the central processing unit;

sending an add/subtract signal;

phase-shifting an internal clocking signal according to the add/subtract signal and outputting a phase-shifted clocking signal;

sending a first special sample format signal to the system bus interface according to a special timing cycle;

adjusting a feedback signal from the system bus to produce a second special sample format signal according to the phase-shifted clocking signal;

receiving the second special sample format signal from the system bus interface according to the special timing cycle;

comparing the first special sample format signal with the second special sample format signal to determine if there is any error or not; and if not, sending out the central processing unit reset signal and the add/subtract control signal several times to obtain the optimum phase adjusting signal for operating the system bus interface.

13. A timing adjustment device for a system bus interface, wherein the system bus interface is coupled to a system bus and the system bus is coupled to a central processing unit (CPU), the timing adjustment device comprising:

a cycle protocol device for outputting a timing adjusting signal to adjust the system bus interface;

a special pattern device coupled to the cycle protocol device and the system bus interface for receiving a special sample format signal from the system bus interface during the special timing cycle in response of the timing adjusting signal;

an add/subtract device for outputting a phase signal according to an add/subtract signal;

a phase lock loop device coupled to the add/subtract device and the system bus interface for receiving the phase signal and an internal clocking signal, wherein the phase lock loop device shifts the internal clocking signal according to the phase signal and outputs a phase-shifted clocking signal; and a core logic device coupled to the central processing unit and the add/subtract device for sending a central processing unit reset signal to the central processing unit and asserting the add/subtract control signal when adjusting the system bus interface;

wherein the system bus interface adjusts and drives a result signal of the system bus to become the special sample format signal according to the phase-shifted clocking signal.

14. The timing adjustment device of claim 13, wherein the core logic device also asserts the central processing unit reset signal and add/subtract control signal repeatedly a number of times to obtain the optimum phase signal for operating the system bus interface.

15. The timing adjustment device of claim 13, wherein the system bus interface further comprises:

a buffer for receiving the result signal from the central processing unit, boosting the current of the result signal and outputting the result signal; and a latching device coupled to the special pattern device, the phase lock loop device and the buffer for receiving and holding the result signal and using the phase-shifted clocking signal as a timing signal to drive the latching device so that the latching device outputs the special sample format signal.

16. The timing adjustment device of claim 13, wherein the phase lock loop device further receives a signal N for determining the phase value in each shifting of the internal clocking signal.

17. A control chipset coupled to a central processing unit through a system bus, comprising:

a system bus interface coupled to the system bus for latching and buffering the signals between the control chipset and the central processing unit; and a timing adjustment device coupled to the system bus interface for controlling the system bus interface, adjusting the timing of signal between the control chipset and the system bus, the timing adjustment device further comprising:

a cycle protocol device for outputting a timing adjusting signal to adjust the system bus interface;

a special pattern device coupled to the cycle protocol device and the system bus interface for receiving a special sample format signal from the system bus interface during the special timing cycle in response of the timing adjusting signal;

an add/subtract device for outputting a phase signal according to an add/subtract signal;

a phase lock loop device coupled to the add/subtract device and the system bus interface for receiving the phase signal and an internal clocking signal, wherein the phase lock loop device shifts the internal clocking signal according to the phase adjusting signal and outputs a phase-shifted clocking signal; and a core logic device coupled to the central processing unit and the add/subtract device for sending a central processing unit reset signal to the central processing unit and asserting the add/subtract control signal when adjusting the system bus interface;

wherein the system bus interface adjusts and drives a result signal of the system bus to become the special sample format signal according to the phase-shifted clocking signal.

18. The control chipset of claim 17, wherein the core logic device also asserts the central processing unit reset signal and add/subtract control signal repeatedly a number of times to obtain the optimum phase signal for operating the system bus interface.

19. The control chipset of claim 17, wherein the system bus interface further comprises:

a buffer for receiving the result signal from the central processing unit, boosting the current of the result signal and outputting the boosted result signal; and a latching device coupled to the special pattern device, the phase lock loop device and the buffer for receiving and holding the result signal and using the phase-shifted clocking signal as a timing signal to drive the latching device so that the latching device outputs the special sample format signal.

20. A timing adjustment device of a chip bus interface for adjusting the timing signal of the chip bus interface inside a first chip, wherein the chip bus interface is coupled to a bus and the bus is coupled to a second chip, and the second chip further includes a chip bus interface, the timing adjustment device comprising:

a cycle protocol device for generating a special timing cycle and outputting an expected timing signal when adjusting the timing of the chip bus interface inside the first chip;

a special pattern device coupled to the cycle protocol device and the chip bus interface of the first chip for receiving the expected timing signal and outputting a special sample format signal to the chip bus interface of the first chip during the special timing cycle;

an add/subtract device for increasing/decreasing a phase adjusting signal; and a phase lock loop device coupled to the add/subtract device and the chip bus interface of the first chip for receiving the phase adjusting signal and an internal clocking signal, wherein the phase lock loop device shifts the internal clocking signal according to the phase adjusting signal and outputs a phase-shifted clocking signal, and the chip bus interface of the first chip adjusts and drives the special sample format signal to the bus according to the phase-shifted clocking signal;

wherein in the process of adjusting the chip bus interface of the first chip, the first chip increases/decreases and asserts the phase adjusting signal repeatedly several times so that the chip bus interface of the first chip adjusts and drives the special sample format signal to the bus repeatedly several times, and through the determination of the correctness of the special sample format signal received by the chip bus interface of the second chip, the optimum phase adjusting signal for operating the chip bus interface of the first chip is obtained.

21. The timing adjustment device of claim 20, wherein the chip bus interface of the first chip further comprises:

a latching device coupled to the special pattern device and the phase lock loop device for registering the special sample format signal and using the phase-shifted clocking signal as a timing signal to drive the latching device so that the latching device outputs an adjusted special sample format signal; and a buffer coupled to the latching device for receiving the adjusted special sample format signal, boosting the current of the adjusted special sample format signal and sending the adjusted special sample format signal to the bus.

22. The timing adjustment device of claim 21, wherein the chip bus interface further comprises:

a drive-boosting controller coupled to the buffer for outputting a drive-boosting signal and controlling the driving capability of the buffer.

23. The timing adjustment device of claim 20, wherein the phase lock loop device further receives a signal N for determining the phase value in each shifting of the internal clocking signal.

24. A main control chip of a control chipset coupled to a slave control chip via a bus, comprising:

a chip bus interface coupled to the bus for latching and buffering signals between the main control chip and the slave control chip; and a timing adjustment device coupled to the chip bus interface for controlling the chip bus interface and adjusting the timing signal between the main control chip and the bus, and the timing adjustment device comprising:

a cycle protocol device for generating a special timing cycle and outputting an expected timing signal when adjusting the timing of the chip bus interface inside the main control chip;

a special pattern device coupled to the cycle protocol device and the chip bus interface of the main control chip for receiving the expected timing signal and outputting a special sample format signal to the chip bus interface of the main control chip during the special timing cycle;

an add/subtract device for increasing/decreasing a phase adjusting signal; and a phase lock loop device coupled to the add/subtract device and the chip bus interface of the main control chip for receiving the phase adjusting signal and an internal clocking signal, wherein the phase lock loop device shifts the internal clocking signal according to the phase adjusting signal and outputs a phase-shifted clocking signal, and the chip bus interface of the main control chip adjusts and drives the special sample format signal to the bus according to the phase-shifted clocking signal;

wherein in the process of adjusting the chip bus interface of the main control chip, the main control chip increases/decreases and asserts the phase adjusting signal repeatedly several times so that the chip bus interface of the first chip adjusts and drives the special sample format signal to the bus repeatedly several times, and through the determination of the correctness of the special sample format signal received by the slave control chip, the optimum phase adjusting signal for operating the chip bus interface of the main control chip is obtained.

25. The timing adjustment device of claim 24, wherein the chip bus interface of the main control chip further comprises:

a latching device coupled to the special pattern device and the phase lock loop device for registering the special sample format signal and using the phase-shifted clocking signal as a timing signal to drive the latching device so that the latching device outputs an adjusted special sample format signal; and a buffer coupled to the latching device for receiving the adjusted special sample format signal, boosting the current of the adjusted special sample format signal and sending the adjusted special sample format signal to the bus.

26. The timing adjustment device of claim 25, wherein the chip bus interface further comprises:

a drive-boosting controller coupled to the buffer for outputting a drive-boosting signal and controlling the driving capability of the buffer.

27. The timing adjustment device of claim 24, wherein the main control chip is a north bridge control chip.

28. The timing adjustment device of claim 24, wherein the main control chip is a south bridge control chip.

29. A control chipset, comprising:

a first control chip coupled to a bus; comprising:

a chip bus interface coupled to the bus for latching and buffering the signals between the first control chip and the bus; and a timing adjustment device coupled to the chip bus interface of the first control chip for controlling the chip bus interface of the first control chip and adjusting the timing of signals between the first control chip and the bus, and the timing adjustment device comprising:

a cycle protocol device for generating a special timing cycle and outputting an expected timing signal when adjusting the timing of the chip bus interface inside the first control chip;

a special pattern device coupled to the cycle protocol device and the chip bus interface of the first control chip for receiving the expected timing signal and outputting a special sample format signal to the chip bus interface of the first control chip during the special timing cycle;

an add/subtract device for increasing/decreasing a phase adjusting signal; and a phase lock loop device coupled to the add/subtract device and the chip bus interface of the first control chip for receiving the phase adjusting signal and an internal clocking signal, wherein the phase lock loop device shifts the internal clocking signal according to the phase adjusting signal and outputs a phase-shifted clocking signal, and the chip bus interface of the first control chip adjusts and drives the special sample format signal to the bus according to the phase-shifted clocking signal;

a second control chip coupled to the bus, comprising:
a chip bus interface coupled to the bus for latching and buffering the signals between the second control chip and the bus; and
a special pattern device coupled to the chip bus interface of the second control chip;

wherein in the process of adjusting the chip bus interface of the first control chip, the first control chip increases/decreases and asserts the phase adjusting signal repeatedly several times so that the chip bus interface of the first control chip adjusts and drives the special sample format signal to the bus repeatedly several times, the chip bus interface of the second control chip receives the signals on the bus, and through the determination of the correctness of the special sample format signal received by the second control chip, the optimum phase adjusting signal for operating the chip bus interface of the first control chip is obtained.

30. A method of adjusting the timing of the chip bus interface of a first control chip, wherein the chip bus interface is coupled to a bus and the bus is coupled to a second control chip, and the second control chip further includes a chip bus interface, the timing adjustment method comprising the steps of:

sending a phase adjusting signal to shift an internal clocking signal and output a phase-shifted clocking signal;

according to a special timing cycle, sending a first special sample format signal to the chip bus interface of the first control chip;

according to the phase-shifted clocking signal, the chip bus interface of the first control chip adjusts and drives the first special sample format signal to the bus;

receiving the signals on the bus from the chip bus interface of the second control chip, the second control chip compares and determines if the first special sample format signal is correctly received or not; and if correctly received, re-asserting the phase adjusting signal several times to obtain the optimum phase adjusting signal for operating the chip bus interface.

31. The timing method of claim 30, wherein the method further comprises the following steps:

according to the special timing cycle, the chip bus interface of the second control chip drives a second special sample format signal to the bus; and according to the phase-shifted clocking signal, the chip bus interface of the first control chip adjusts and latches the signals on the bus, and the first control chip compares to determine if the second special sample format signal is correctly received.

32. A memory controller coupled to a memory bus that couples with a memory unit, the memory controller comprising:

a memory initialization device coupled to the memory bus for initializing the memory unit, wherein the memory unit may is able to operate normally only after the initialization;

a memory bus interface coupled to the memory bus for latching and buffering the signals between the memory controller and the memory unit; and a timing adjustment device coupled to the memory bus interface for controlling the memory bus interface and adjusting the timing of signals between the memory controller and the memory bus, the timing adjustment device comprising:

a cycle protocol device for generating a special timing cycle and outputting an expected timing signal when adjusting the timing of the memory bus interface;

a special pattern device coupled to the cycle protocol device and the memory bus interface for receiving the expected timing signal, sending a first special sample format signal to the memory bus interface and receiving a second special sample format signal from the memory bus interface during the special timing cycle;

a first add/subtract device for increasing/decreasing a first phase adjusting signal;

a second add/subtract device for increasing/decreasing a second adjusting signal;

a first phase lock loop device coupled to the first add/subtract device and the memory bus interface for receiving the first phase adjusting signal and an internal clocking signal, wherein the first phase lock loop device shifts the internal clocking signal according to the first phase adjusting signal and outputs a first phase-shifted clocking signal, and the memory bus interface drives the first special sample format signal to the memory bus according to the first phase-shifted clocking signal; and a second phase lock loop device coupled to the second add/subtract device and the memory bus interface for receiving the second phase adjusting signal and an internal clocking signal, wherein the second phase lock loop device shifts the internal clocking signal according to the second phase adjusting signal and outputs a second phase-shifted clocking signal, and the memory bus interface adjusts and drives the signals on the memory bus to become the second special sample format signal according to the second phase-shifted clocking signal;

wherein the first add/subtract device and the second add/subtract device increases/decreases and re-asserts the first phase adjusting signal and the second phase adjusting signal repeatedly a number of times and compares the received first special sample format signal and the second special sample format signal to obtain the optimal phase adjusting signal for operating the memory bus interface.

33. The memory controller of claim 32, wherein the memory bus interface further includes:

a first latching device coupled to the special pattern device and the first phase lock loop device for registering the first special sample format signal and using the first phase-shifted clocking signal as a timing signal to drive the first latching device so that the first latching device outputs an adjusted first special sample format signal;

a first buffer coupled to the first latching device for receiving the adjusted first special sample format signal, boosting the current of the adjusted first special sample format signal and outputting the adjusted first special sample format signal to the memory unit; and a drive-boosting controller coupled to the first buffer for outputting a drive-boosting signal to control the driving capability of the first buffer.

34. The memory controller of claim 33, wherein the memory bus interface further includes:
- a second buffer for receiving, boosting and outputting signals on the memory bus; and
- a second latching device coupled to the special pattern device, the second phase lock loop device and the second buffer for receiving and holding signals on the memory bus output from the second buffer and using the second phase-shifted clocking signal as a timing signal to drive the second latching device so that the second latching device outputs the adjusted second special sample format signal.

35. The memory controller of claim 32, wherein the first phase lock loop device and the second phase lock loop device further receives a signal N for determining the phase value in each shifting of the internal clocking signal.

36. A memory controller coupled to a memory bus that couples with a memory unit, the memory controller comprising:
- a memory bus interface coupled to the memory bus for latching and buffering the signals between the memory controller and the memory unit; and
- a timing adjustment device coupled to the memory bus interface for controlling the memory bus interface and adjusting the timing of signals between the memory controller and the memory bus, the timing adjustment device comprising:
    - a cycle protocol device for generating a special timing cycle and outputting an expected timing signal when adjusting the timing of the memory bus interface;
    - a special pattern device coupled to the cycle protocol device and the memory bus interface for receiving the expected timing signal, sending a special sample format signal to the memory bus interface during the special timing cycle;
    - an add/subtract device for increasing/decreasing a phase adjusting signal; and
    - a phase lock loop device coupled to the add/subtract device and the memory bus interface for receiving the phase adjusting signal and an internal clocking signal, wherein the phase lock loop device shifts the internal clocking signal according to the phase adjusting signal and outputs a phase-shifted clocking signal, and the memory bus interface drives the special sample format signal to the memory bus according to the phase-shifted clocking signal;
- wherein the add/subtract device increases/decreases and re-asserts the phase adjusting signal repeatedly a number of times and checks the correctness of the special sample format signal received by the memory unit to obtain the optimal phase adjusting signal for operating the memory bus interface.

37. The memory controller of claim 36, wherein the memory bus interface further includes:
- a latching device coupled to the special pattern device and the phase lock loop device for registering the special sample format signal and using the phase-shifted clocking signal as a timing signal to drive the latching device so that the latching device outputs an adjusted special sample format signal;
- a buffer coupled to the latching device for receiving the adjusted special sample format signal, boosting the current of the adjusted special sample format signal and outputting the adjusted special sample format signal to the memory unit; and
- a drive-boosting controller coupled to the buffer for outputting a drive-boosting signal to control the driving capability of the buffer.

38. The memory controller of claim 36, wherein the phase lock loop device further receives a signal N for determining the phase value in each shifting of the internal clocking signal.

39. A timing adjustment method for adjusting the memory bus interface of a memory controller, wherein the memory bus interface is coupled to a memory bus and the memory bus is coupled to a memory, the timing adjustment method comprising the steps of:
- initializing the memory;
- sending out a phase adjusting signal;
- shifting an internal clocking signal according to the phase adjusting signal and sending out a phase-shifted clocking signal;
- sending a first special sample format signal to the memory bus interface according to a special timing cycle;
- according to the phase-shifted clocking signal, the memory bus interface drives the first special sample format signal to the memory bus;
- according to the phase-shifted clocking signal, the memory bus interface receives the signals on the memory bus to produce a second special sample format signal;
- receiving the second special sample format signal from the memory bus interface according to the special timing cycle;
- comparing the first special sample format signal and the second special sample format signal; and
- increasing/decreasing and re-asserting the phase adjusting signal repeatedly a number of times to obtain the optimal phase adjusting signal for operating the memory bus interface.

* * * * *